(12) United States Patent
Pei

(10) Patent No.: US 11,121,349 B2
(45) Date of Patent: Sep. 14, 2021

(54) METHOD FOR MANUFACTURING AN ORGANIC ELECTROLUMINESCENCE DISPLAY DEVICE HAVING SEPARATE HOLE BLOCKING LAYERS

(71) Applicant: WUHAN CHINA STAR OPTOELECTRONICS SEMICONDUCTOR DISPLAY TECHNOLOGY CO., LTD., Wuhan (CN)

(72) Inventor: Long Pei, Wuhan (CN)

( * ) Notice: Subject to any disclaimer, the term of this patent is extended or adjusted under 35 U.S.C. 154(b) by 291 days.

(21) Appl. No.: 16/349,281

(22) PCT Filed: Mar. 19, 2019

(86) PCT No.: PCT/CN2019/078599
§ 371 (c)(1),
(2) Date: May 13, 2019

(87) PCT Pub. No.: WO2020/113852
PCT Pub. Date: Jun. 11, 2020

(65) Prior Publication Data
US 2021/0184154 A1    Jun. 17, 2021

(30) Foreign Application Priority Data
Dec. 5, 2018    (CN) .......................... 201811476819.X

(51) Int. Cl.
*H01L 51/56* (2006.01)
*H01L 51/50* (2006.01)
*H01L 27/32* (2006.01)

(52) U.S. Cl.
CPC .......... *H01L 51/56* (2013.01); *H01L 51/5056* (2013.01); *H01L 51/5096* (2013.01); *H01L 27/3209* (2013.01)

(58) Field of Classification Search
CPC .. H01L 51/5056; H01L 51/5096; H01L 51/56
See application file for complete search history.

(56) References Cited

U.S. PATENT DOCUMENTS

2002/0121859 A1*  9/2002  Hayashi .............. H01L 51/5096
                                                      313/504
2003/0042848 A1   3/2003  Park et al.
(Continued)

FOREIGN PATENT DOCUMENTS

CN    100433397 C    11/2008
CN    102184938 A     9/2011
(Continued)

*Primary Examiner* — Michael Jung

(57) ABSTRACT

A display apparatus, and an organic electroluminescence display device and a manufacturing method thereof are provided. The organic electroluminescence display device includes a hole transport functional layer; a light emitting layer disposed on the hole transport functional layer, which includes a first, a second, and a third light emitting regions that emit light rays of different colors; a hole blocking layer disposed on the light emitting layer, which includes a first, a second, and a third hole blocking regions that are disposed at different positions, the first, the second, and the third hole blocking layers disposed at positions corresponding to the first, the second, and the third light emitting regions, respectively; and an electron transport functional layer disposed on the hole blocking layer. The present application solves a technical problem of color mixing for light rays emitted from the light emitting layer and improves product yield.

7 Claims, 3 Drawing Sheets

(56) References Cited

U.S. PATENT DOCUMENTS

| | | |
|---|---|---|
| 2014/0175387 A1 | 6/2014 | Lin |
| 2015/0318509 A1* | 11/2015 | Song .................. H01L 51/5016 257/40 |
| 2017/0250234 A1 | 8/2017 | He et al. |
| 2019/0006632 A1 | 1/2019 | Pei et al. |

FOREIGN PATENT DOCUMENTS

| | | |
|---|---|---|
| CN | 103887435 A | 6/2014 |
| CN | 105185919 A | 12/2015 |
| CN | 106449714 A | 2/2017 |
| CN | 107170897 A | 9/2017 |
| CN | 107359279 A | 11/2017 |
| CN | 107785491 A | 3/2018 |

\* cited by examiner

METHOD FOR MANUFACTURING AN ORGANIC ELECTROLUMINESCENCE DISPLAY DEVICE HAVING SEPARATE HOLE BLOCKING LAYERS

FIELD OF THE DISCLOSURE

The present application relates to display technologies, and more particularly to a display device, and an organic electroluminescence display device and a manufacturing method thereof.

DESCRIPTION OF RELATED ARTS

In an organic light emitting diode (OLED) display apparatus, every one of pixel structures includes a plurality of subpixels and each of the subpixels includes an organic electroluminescence (EL) display device including an anode, a cathode, and a light emitting layer disposed between the anode and the cathode. The light emitting layer is driven by an electric field between the anode and the cathode and emits light rays by injection and recombination of charge carriers. The light emitting layer can produce light rays of different colors when manufactured using different materials.

FIG. 1 is a schematic diagram showing an organic electroluminescence display device in an existing art. As shown in FIG. 1, the organic electroluminescence display device in the existing art includes a hole injection layer/hole transport layer 10, a fluorescent material layer 11, a light emitting layer 12, a hole blocking layer 13, an electron transport layer 14, and an electron injection layer 15. An anode layer (not shown) is disposed below the hole injection layer/the hole transport layer 10 and a cathode layer (not shown) is disposed above the electron injection layer 15. The fluorescent material layer 11 is configured to assist the light emitting layer 12 to emit light rays. As shown in FIG. 1, the light emitting layer 12 includes a blue light emitting region, a green light emitting region, and a red light emitting region. The fluorescent material layer 11 includes a blue fluorescent material region corresponding to the blue light emitting region, a green fluorescent material region corresponding to the green light emitting region, and a red fluorescent material region corresponding to the red light emitting region.

FIG. 2 is a schematic diagram showing misalignment for light emitting regions of a light emitting layer in the organic electroluminescence display device shown in FIG. 1. In the existing art, the blue light emitting region, the green light emitting region, and the red light emitting region are manufactured by vacuum evaporation using different masks. After the light emitting region corresponding to one specific color is manufactured, the light emitting region corresponding to another specific color is then manufactured. It is easy for this process to cause misalignment. As shown in FIG. 2, a color mixing region R (indicated by a dash line shown in FIG. 2) is formed because of misalignment of the blue light emitting region and the green light emitting region of the light emitting layer 12. This results in mixing blue light and green light. The organic electroluminescence display device of the existing art has a serious problem of color mixing, which affects product yield.

TECHNICAL PROBLEMS

An objective of the present application is to provide a display device, and an organic electroluminescence display device and a manufacturing method thereof, for solving the technical problem of color mixing for light rays emitted from a light emitting layer and improving product yield.

TECHNICAL SOLUTIONS

To achieve above objective, an aspect of the present application provides an organic electroluminescence display device, including:

a hole transport functional layer;

a light emitting layer, disposed on the hole transport functional layer, the light emitting layer including a first light emitting region, a second light emitting region, and a third light emitting region that emit light rays of different colors;

a hole blocking layer, disposed on the light emitting layer, the hole blocking layer including a first hole blocking region, a second hole blocking layer, and a third hole blocking layer that are disposed at different positions, the first hole blocking layer disposed at a position corresponding to the first light emitting region, the second hole blocking layer disposed at a position corresponding to the second light emitting region, the third hole blocking layer disposed at a position corresponding to the third light emitting region; and an electron transport functional layer, disposed on the hole blocking layer.

In an embodiment of the present application, the organic electroluminescence display device further includes:

a fluorescent material layer, disposed between the hole transport functional layer and the light emitting layer, the fluorescent material layer including a first fluorescent material region, a second fluorescent material region, and a third fluorescent material region that correspond to different colors, the first fluorescent material region disposed at a position corresponding to the first light emitting region, the second fluorescent material region disposed at a position corresponding to the second light emitting region, the third fluorescent material region disposed at a position corresponding to the third light emitting region.

In an embodiment of the present application, the first light emitting region, the second light emitting region, and the third light emitting region are of a blue region, a green region, and a red region, respectively, and the first fluorescent material region, the second fluorescent material region, and the third fluorescent material region are of a blue fluorescent material region, a green fluorescent material region, and a red fluorescent material region, respectively.

In an embodiment of the present application, the hole transport functional layer includes at least one of a hole transport layer and a hole injection layer.

In an embodiment of the present application, the electron transport functional layer includes at least one of an electron transport layer and an electron injection layer.

In another aspect, the present application provides a method for manufacturing an organic electroluminescence display device, including:

disposing a hole transport functional layer;

disposing a light emitting layer on the hole transport functional layer, the light emitting layer including a first light emitting region, a second light emitting region, and a third light emitting region that emit light rays of different colors;

disposing a hole blocking layer on the light emitting layer, the hole blocking layer including a first hole blocking region, a second hole blocking layer, and a third hole blocking layer that are disposed at different positions, the first hole blocking layer disposed at a position corresponding to the first light emitting region, the second hole blocking layer disposed at a position corresponding to the second light emitting region, the third hole blocking layer disposed at a position corresponding to the third light emitting region; and disposing an electron transport functional layer on the hole blocking layer.

In an embodiment of the present application, in the step of disposing the light emitting layer and the step of disposing the hole blocking layer, the first light emitting region, the first hole blocking region, the second light emitting region, the second hole blocking region, the third light emitting region, and the third hole blocking region are sequentially disposed.

In an embodiment of the present application, the step of disposing the light emitting layer and the step of disposing the hole blocking layer include:

adopting a same mask to manufacture the first light emitting region and the first hole blocking region under a same vacuum evaporation process;

adopting a same mask to manufacture the second light emitting region and the second hole blocking region under a same vacuum evaporation process; and adopting a same mask to manufacture the third light emitting region and the third hole blocking region under a same vacuum evaporation process.

In an embodiment of the present application, the first light emitting region, the second light emitting region, the third light emitting region, the first hole blocking region, the second hole blocking region, and the third hole blocking region are manufactured using film metal masks.

In an embodiment of the present application, the method further includes:

disposing a fluorescent material layer between the hole transport functional layer and the light emitting layer, the fluorescent material layer including a first fluorescent material region, a second fluorescent material region, and a third fluorescent material region that correspond to different colors, the first fluorescent material region disposed at a position corresponding to the first light emitting region, the second fluorescent material region disposed at a position corresponding to the second light emitting region, the third fluorescent material region disposed at a position corresponding to the third light emitting region.

In an embodiment of the present application, the first light emitting region, the second light emitting region, and the third light emitting region are of a blue region, a green region, and a red region, respectively, and the first fluorescent material region, the second fluorescent material region, and the third fluorescent material region are of a blue fluorescent material region, a green fluorescent material region, and a red fluorescent material region, respectively.

In an embodiment of the present application, the hole transport functional layer includes at least one of a hole transport layer and a hole injection layer.

In an embodiment of the present application, the electron transport functional layer includes at least one of an electron transport layer and an electron injection layer.

In still another aspect, the present application provides a display apparatus, including a plurality of organic electroluminescence display devices, each of the organic electroluminescence display devices including:

a hole transport functional layer;

a light emitting layer, disposed on the hole transport functional layer, the light emitting layer including a first light emitting region, a second light emitting region, and a third light emitting region that emit light rays of different colors;

a hole blocking layer, disposed on the light emitting layer, the hole blocking layer including a first hole blocking region, a second hole blocking layer, and a third hole blocking layer that are disposed at different positions, the first hole blocking layer disposed at a position corresponding to the first light emitting region, the second hole blocking layer disposed at a position corresponding to the second light emitting region, the third hole blocking layer disposed at a position corresponding to the third light emitting region; and an electron transport functional layer, disposed on the hole blocking layer.

In an embodiment of the present application, the organic electroluminescence display device further includes:

a fluorescent material layer, disposed between the hole transport functional layer and the light emitting layer, the fluorescent material layer including a first fluorescent material region, a second fluorescent material region, and a third fluorescent material region that correspond to different colors, the first fluorescent material region disposed at a position corresponding to the first light emitting region, the second fluorescent material region disposed at a position corresponding to the second light emitting region, the third fluorescent material region disposed at a position corresponding to the third light emitting region.

In an embodiment of the present application, the first light emitting region, the second light emitting region, and the third light emitting region are of a blue region, a green region, and a red region, respectively, and the first fluorescent material region, the second fluorescent material region, and the third fluorescent material region are of a blue fluorescent material region, a green fluorescent material region, and a red fluorescent material region, respectively.

In an embodiment of the present application, the hole transport functional layer includes at least one of a hole transport layer and a hole injection layer.

In an embodiment of the present application, the electron transport functional layer includes at least one of an electron transport layer and an electron injection layer.

BENEFICIAL EFFECTS

In the present application, the hole blocking layer includes the first hole blocking region, the second hole blocking region, and the third hole blocking region that are disposed at different positions. The first hole blocking region is disposed at a position corresponding to the first light emitting region of the light emitting layer, the second hole blocking region is disposed at a position corresponding to the second light emitting region of the light emitting layer, and the third hole blocking region is disposed at a position corresponding to the third light emitting region of the light emitting layer. When the light emitting regions of the light emitting layer overlaps to each other due to misalignment, the overlapped light emitting regions have the hole blocking region located therebetween. Accordingly, this can effectively prevent the holes from passing through and prevent an upper light emitting region of the overlapped regions from emitting light, and avoid color mixed illumination caused by color mixing of the upper light emitting region and a lower light emitting region of the overlapped regions. Serious color mixing for the organic electroluminescence display device in existing arts is effectively solved and product yield is improved.

DESCRIPTION OF EMBODIMENTS OF THE DISCLOSURE

To make the objectives, technical schemes, and effects of the present application more clear and specific, the present application is described in further detail below with reference to the embodiments in accompanying with the appending drawings. It should be understood that the specific embodiments described herein are merely for explaining the present application, the term "embodiment" used in the context means an example, instance, or illustration, and the present application is not limited thereto.

Figure 3:
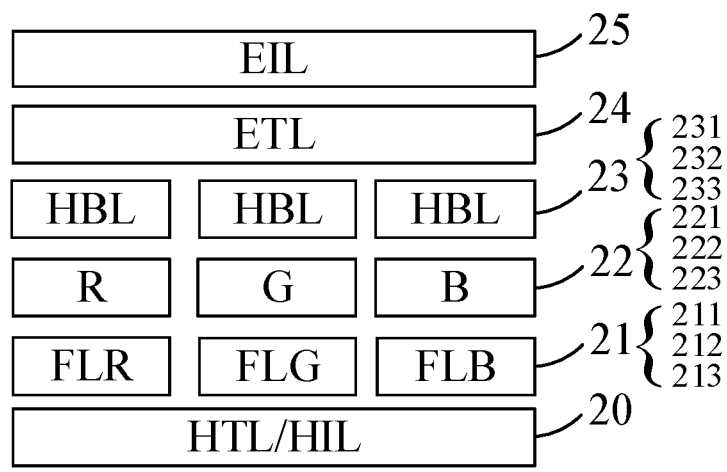
FIG. 3 is a schematic diagram showing an organic electroluminescence display device according to the present application.

FIG. 3 is a schematic diagram showing an organic electroluminescence display device according to the present application. As shown in FIG. 3, the organic electroluminescence (EL) display device includes a hole transport functional layer 20, a fluorescent material layer 21, a light emitting layer 22, a hole blocking layer (HBL) 23, and an electron transport functional layer (including an electron transport layer (ETL) 24 and an electron injection layer (EIL) 25). The organic electroluminescence display device may further include an anode layer (not shown) disposed below the hole transport functional layer 20 and a cathode layer (not shown) disposed above the electron transport functional layer. The light emitting layer 22 is driven by an electric field between the anode and the cathode and emits light rays by injection and recombination of charge carriers (i.e., electrons and holes).

The hole transport functional layer 20 is for hole injection and transmission, which can be a hole transport layer (HTL) or a hole injection layer (HIL), or includes both of the hole transport layer and the hole injection layer. The electron transport functional layer is for electron injection and transmission, which can be the electron transport layer or the electron injection layer, or includes both of the electron transport layer and the electron injection layer. In the example shown in FIG. 3, the hole transport functional layer 20 includes the hole transport layer or the hole injection layer, and the electron transport functional layer includes the electron transport layer 24 and the electron injection layer, but the present application is not limited thereto. Other combinations may also be applicable.

The fluorescent material layer 21 is disposed on the hole transport functional layer 20. Specifically, the fluorescent material layer 21 is disposed between the hole transport functional layer 20 and the light emitting layer 22. The light emitting layer 22 is disposed on the hole transport functional layer 20, and is specifically disposed on the fluorescent material layer 21. The light emitting layer 22 is an organic semiconductor having a special energy band structure. When driven by an electric field between the anode and the cathode, the light emitting layer 22 emits photons of a certain wavelength by recombination of electrons and holes taken place at the light emitting layer 22. The fluorescent material layer 21 is configured to assist the light emitting layer 22 to emit light rays.

As shown in FIG. 3, the fluorescent material layer 21 includes a first fluorescent material region 211, a second fluorescent material region 212, and a third fluorescent material region 213 that correspond to three different colors. For instance, the first fluorescent material region 211, the second fluorescent material region 212, and the third fluorescent material region 213 are of a blue fluorescent material region, a green fluorescent material region, and a red fluorescent material region, respectively. The light emitting layer 22 includes a first light emitting region 221, a second light emitting region 222, and a third light emitting region 223 that emit light rays of three different colors. For instance, an organic material emitting blue light is disposed in the first light emitting region 221, an organic material emitting green light is disposed in the second light emitting region 222, and an organic material emitting red light is disposed in the third light emitting region 223. The first fluorescent material region 211 is disposed at a position corresponding to the first light emitting region 221, the second fluorescent material region 212 is disposed at a position corresponding to the second light emitting region 222, and the third fluorescent material region 213 is disposed at a position corresponding to the third light emitting region 223. For instance, the first fluorescent material region 211 corresponds to the first light emitting region 221, the second fluorescent material region 212 corresponds to the second light emitting region 222, and the third fluorescent material region 213 corresponds to the third light emitting region 223.

The hole blocking layer 23 is disposed on the light emitting layer 22 and is configured to block transmission of the holes from the anode layer. The energy barrier for transmission of electrons between the hole blocking layer 23 and the light emitting layer 22 is far below the energy barrier for transmission of holes. Accordingly, the electrons can pass through the hole blocking layer 23 and get into the light emitting layer 22 and it is difficult for the holes to pass through the hole blocking layer 23. Therefore, the hole blocking layer 23 obviously has a hole blocking function. As shown in FIG. 3, the hole blocking layer 23 includes a first hole blocking region 231, a second hole blocking region 232, and a third hole blocking region 233 that are disposed at different positions. The first hole blocking region 231 is disposed at a position corresponding to the first light emitting region 221, the second hole blocking region 232 is disposed at a position corresponding to the second light emitting region 222, and the third hole blocking region 233 is disposed at a position corresponding to the third light emitting region 223.

As shown in FIG. 3, the electron transport layer 24 is disposed on the hole blocking layer 23 and the electron injection layer 25 is disposed on the electron transport layer 24. In other embodiments, only the electron transport layer 24 is disposed or only the electron injection layer 25 is disposed. In addition, an electron blocking layer (not shown) may be disposed between the hole transport functional layer 20 and the light emitting layer 22 or between the hole transport functional layer 20 and the fluorescent material layer 21.

Figure 4:
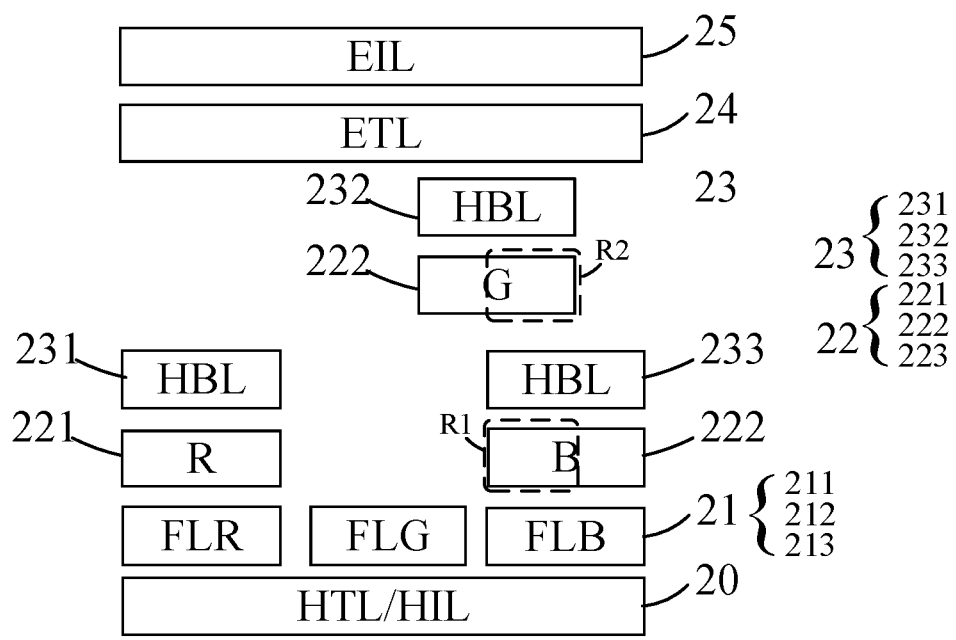
FIG. 4 is a schematic diagram showing misalignment for light emitting regions of a light emitting layer in the organic electroluminescence display device shown in FIG. 3.

FIG. 4 is a schematic diagram showing misalignment for light emitting regions of a light emitting layer in the organic electroluminescence display device shown in FIG. 3. When a color mixing region is generated due to misalignment occurred in the light emitting regions of the light emitting layer 22, holes in the color mixing region cannot pass through the hole blocking region to emit light, thereby effectively inhibiting or suppressing color mixing. For instance, as shown in FIG. 4, the green light emitting region overlaps with the blue light emitting region due to misalignment in manufacturing processes. Meanwhile, the blue light emitting region is up and the green light emitting region is down. Parts of them overlaps with each other. More specifically, the blue light emitting region, the hole blocking region corresponding to the blue light emitting region, the green light emitting region, and the hole blocking region corresponding to the green light emitting region are arranged from bottom to top. The color mixing region R1 (indicated by a dash line shown in FIG. 4) in the blue light emitting region can emit blue light normally since holes are not blocked by the hole blocking region. As to the color mixing region R2 (indicated by a dash line shown in FIG. 4) in the green light emitting region, holes are blocked by the hole blocking region corresponding to the blue light emitting region when the holes are transmitted from the blue light emitting region to the green light emitting region. Accordingly, the holes cannot get into the color mixing region R2 in the green light emitting region. Light rays with mixing colors will not be generated by the blue light emitting region and the green light emitting region, thereby effectively inhibiting or suppressing the color mixing.

In the organic electroluminescence display device of the present application, the hole blocking layer 23 includes the first hole blocking region 231, the second hole blocking region 232, and the third hole blocking region 233 that are disposed at different positions. The first hole blocking region 231 is disposed at a position corresponding to the first light emitting region 221 of the light emitting layer 22, the second hole blocking region 232 is disposed at a position corresponding to the second light emitting region 222 of the light emitting layer 22, and the third hole blocking region 233 is disposed at a position corresponding to the third light emitting region 223 of the light emitting layer 22. When the light emitting regions of the light emitting layer 22 overlaps to each other due to misalignment, the overlapped light emitting regions have the hole blocking region located therebetween. Accordingly, this can effectively prevent the holes from passing through and prevent an upper light emitting region of the overlapped regions from emitting light, and avoid color mixed illumination caused by color mixing of the upper light emitting region and a lower light emitting region of the overlapped regions. Serious color mixing for the organic electroluminescence display device in existing arts is effectively solved and product yield is improved.

Figure 5:
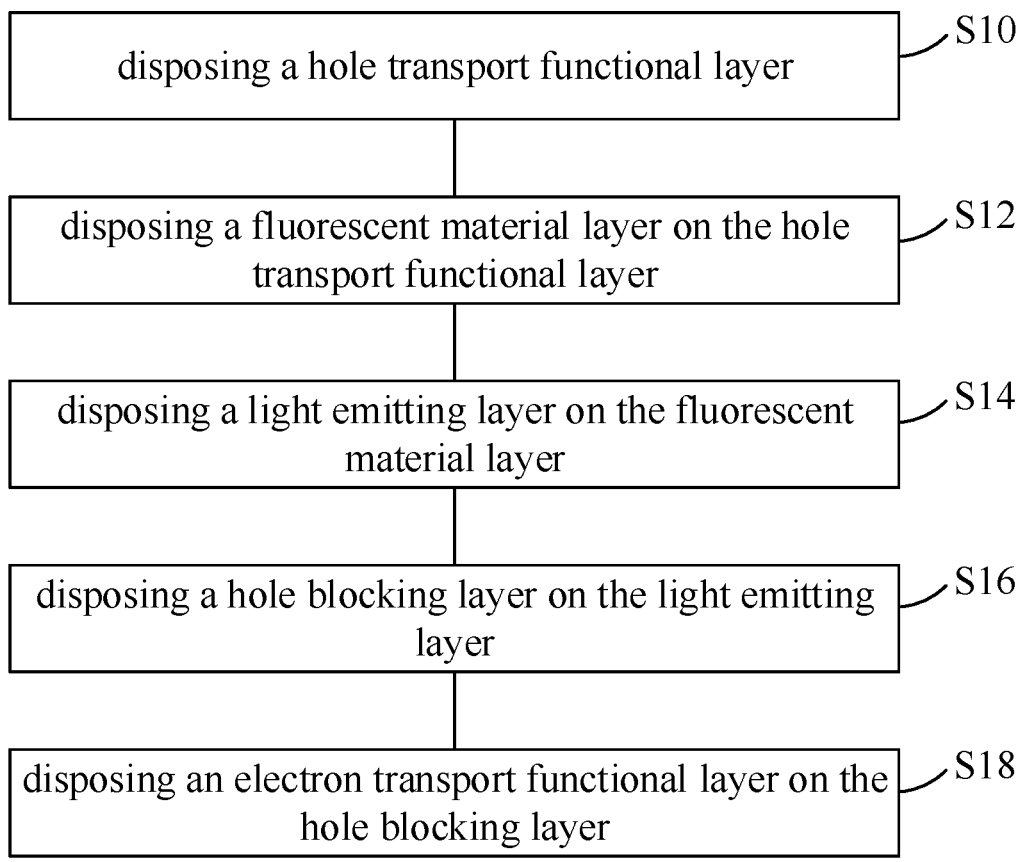
FIG. 5 is a flowchart of a method for manufacturing an organic electroluminescence display device according to the present application.

FIG. 5 is a flowchart of a method for manufacturing an organic electroluminescence display device according to the present application. Referring to FIGS. 3 and 5, the organic electroluminescence display device manufacturing method of the present application includes the following steps.

In Step S10, a hole transport functional layer 20 is disposed. The hole transport functional layer 20 is for hole injection and transmission, which can be a hole transport layer (HTL) or a hole injection layer (HIL), or includes both of the hole transport layer and the hole injection layer. In the example illustrated in FIG. 3, the hole transport functional layer 20 includes a hole transport layer or a hole injection layer. However, it can also be implemented by disposing the hole injection layer and then disposing the hole transport layer on the hole injection layer. Optionally, the method includes a step of disposing an electron blocking layer (not shown) on the hole transport functional layer 20. The electron blocking layer is configured to block transmission of electrons.

In Step S12, a fluorescent material layer 21 is disposed on the hole transport functional layer 20.

In Step S14, a light emitting layer 22 is disposed on the fluorescent material layer 21.

The fluorescent material layer 21 is disposed on the hole transport functional layer 20, and the light emitting layer 22 is disposed on the fluorescent material layer 21. That is, the fluorescent material layer 21 is disposed between the hole transport functional layer 20 and the light emitting layer 22. The light emitting layer 22 is an organic semiconductor having a special energy band structure. When driven by an electric field between the anode and the cathode, the light emitting layer 22 emits photons of a certain wavelength by recombination of electrons and holes taken place at the light emitting layer 22. The fluorescent material layer 21 is configured to assist the light emitting layer 22 to emit light rays.

As shown in FIG. 3, the fluorescent material layer 21 includes a first fluorescent material region 211, a second fluorescent material region 212, and a third fluorescent material region 213 that correspond to three different colors. For instance, the first fluorescent material region 211, the second fluorescent material region 212, and the third fluorescent material region 213 are of a blue fluorescent material region, a green fluorescent material region, and a red fluorescent material region, respectively. The light emitting layer 22 includes a first light emitting region 221, a second light emitting region 222, and a third light emitting region 223 that emit light rays of three different colors. For instance, an organic material emitting blue light is disposed in the first light emitting region 221, an organic material emitting green light is disposed in the second light emitting region 222, and an organic material emitting red light is disposed in the third light emitting region 223. The first fluorescent material region 211 is disposed at a position corresponding to the first light emitting region 221, the second fluorescent material region 212 is disposed at a position corresponding to the second light emitting region 222, and the third fluorescent material region 213 is disposed at a position corresponding to the third light emitting region 223. For instance, the first fluorescent material region 211 corresponds to the first light emitting region 221, the second fluorescent material region 212 corresponds to the second light emitting region 222, and the third fluorescent material region 213 corresponds to the third light emitting region 223.

In Step S16, a hole blocking layer (HBL) 23 is disposed on the light emitting layer 22. The hole blocking layer 23 is configured to block transmission of the holes from an anode layer. The energy barrier for transmission of electrons between the hole blocking layer 23 and the light emitting layer 22 is far below the energy barrier for transmission of holes. Accordingly, the electrons can pass through the hole blocking layer 23 and get into the light emitting layer 22 and it is difficult for the holes to pass through the hole blocking layer 23. Therefore, the hole blocking layer 23 obviously has a hole blocking function. As shown in FIG. 3, the hole blocking layer 23 includes a first hole blocking region 231, a second hole blocking region 232, and a third hole blocking region 233 that are disposed at different positions. The first hole blocking region 231 is disposed at a position corresponding to the first light emitting region 221, the second hole blocking region 232 is disposed at a position corresponding to the second light emitting region 222, and the third hole blocking region 233 is disposed at a position corresponding to the third light emitting region 223.

In Step S18, the hole blocking layer 23 is disposed on the electron transport functional layer. The electron transport functional layer is for electron injection and transmission, which can be an electron transport layer (ETL) 24 or an electron injection layer (EIL) 25, or includes both of the electron transport layer 24 and the electron injection layer 25. In the example illustrated in FIG. 3, the electron transport functional layer includes the electron transport layer 24 and the electron injection layer 25. However, it can be implemented by disposing the electron transport layer 24 only, or by disposing the electron injection layer 25 only.

In Step S14 for disposing the light emitting layer 22 and Step S16 for disposing the hole blocking layer 23, the first light emitting region 221, the first hole blocking region 231, the second light emitting region 222, the second hole blocking region 232, the third light emitting region 223, and the third hole blocking region 233 are sequentially disposed.

Specifically, a same mask is adopted to manufacture the first light emitting region 221 and the first hole blocking region 231 under a same vacuum evaporation process. For example, by vacuum evaporation, a blue light emitting region and a hole blocking region corresponding to the blue light emitting region are manufactured using a same mask under a same process. A same mask is adopted to manufacture the second light emitting region 222 and the second hole blocking region 232 under a same vacuum evaporation process. For example, by vacuum evaporation, a green light emitting region and a hole blocking region corresponding to the green light emitting region are manufactured using a same mask under a same process. A same mask is adopted to manufacture the third light emitting region 223 and the third hole blocking region 233 under a same vacuum evaporation process. For example, by vacuum evaporation, a red light emitting region and a hole blocking region corresponding to the red light emitting region are manufactured using a same mask under a same process.

That is, Step S14 for disposing the light emitting layer 22 and Step S16 for disposing the hole blocking layer 23 include:

adopting a same mask to manufacture the first light emitting region 221 and the first hole blocking region 231 under a same vacuum evaporation process;

adopting a same mask to manufacture the second light emitting region 222 and the second hole blocking region 232 under a same vacuum evaporation process; and adopting a same mask to manufacture the third light emitting region 232 and the third hole blocking region 233 under a same vacuum evaporation process.

Figure 1:
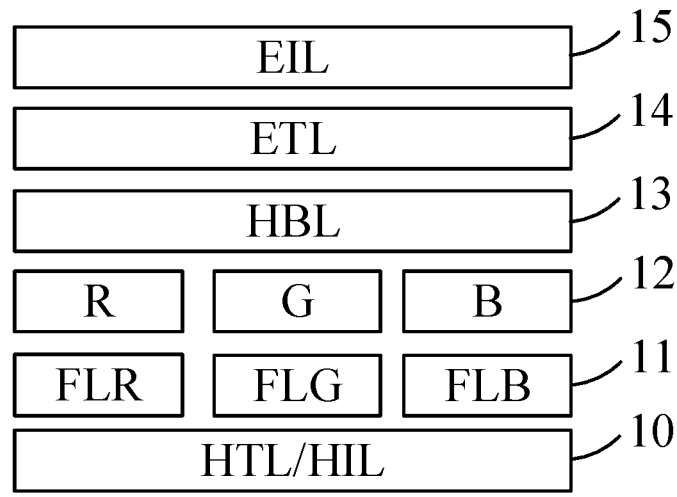
FIG. 1 is a schematic diagram showing an organic electroluminescence display device in an existing art.
Figure 2:
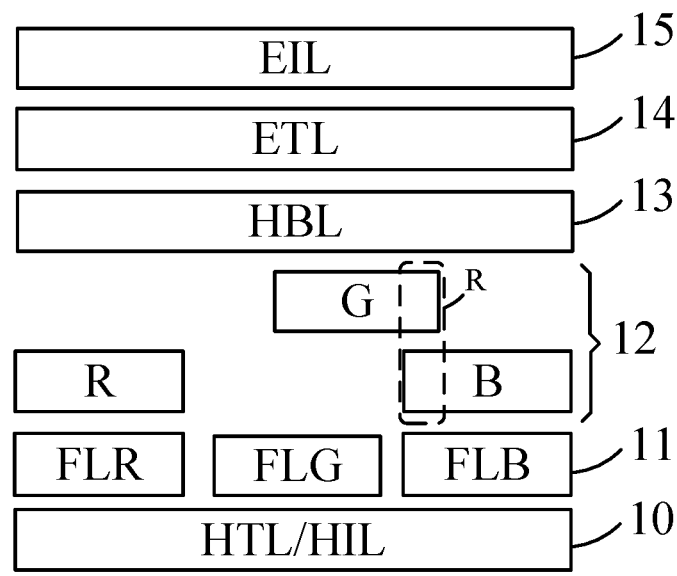
FIG. 2 is a schematic diagram showing misalignment for light emitting regions of a light emitting layer in the organic electroluminescence display device shown in FIG. 1.

In the existing organic electroluminescence display device shown in FIG. 1, the blue light emitting region, the green light emitting region, and the red light emitting region of the light emitting layer are manufactured using film metal masks (FMMs) by vacuum evaporation, and the hole injection layer, the hole transport layer, the hole blocking layer, the electron transport layer, and the electron injection layer are manufactured using common metal masks by vacuum evaporation. In the existing organic electroluminescence display device, the light emitting layer and the hole blocking layer are manufactured by sequentially manufacturing the first light emitting region, the second light emitting region, the third light emitting region, and the hole blocking layer.

In the present application, the hole injection layer, the hole transport layer, and the electron injection layer are manufactured using common metal masks by vacuum evaporation. However, during manufacturing the light emitting layer and the hole blocking layer, the first light emitting region 221 and the first hole blocking region 231 corresponding thereto are manufactured using a same film metal mask under a same vacuum evaporation process, the second light emitting region 222 and the second hole blocking region 232 corresponding thereto are manufactured using a same film metal mask under a same vacuum evaporation process, and the third light emitting region 223 and the third hole blocking region 233 corresponding thereto are manufactured using a same film metal mask under a same vacuum evaporation process. Accordingly, in manufacturing the light emitting regions and the hole blocking regions, there is no need to change the mask frequently and frequently alter the vacuum evaporation process. Compared to the method for manufacturing the organic electroluminescence display device, three film metal masks are at most used in the present application to manufacture the light emitting regions of the light emitting layer 22 and the hole blocking regions of the hole blocking layer 23. However, three film metal masks and one common metal mask are needed in the existing arts. Moreover, three vacuum evaporation processes are at most used in the present application to manufacture the light emitting regions of the light emitting layer 22 and the hole blocking regions of the hole blocking layer 23. However, four vacuum evaporation processes are needed in the existing arts. Accordingly, effectively reducing complexity in the manufacturing processes is one of technical effects of the present application.

In the present application, the hole injection layer, the hole transport layer, the fluorescent material layer 21, the light emitting layer 22, the hole blocking layer 23, the electron transport layer 24, and the electron injection layer 25 can be manufactured using existing material and by adopting manufacturing processes as the same as or similar to existing processes, which are not detailed herein.

Referring to FIG. 4, when a color mixing region is generated due to misalignment occurred in the light emitting regions of the light emitting layer 22, holes in the color mixing region cannot pass through the hole blocking region to emit light, thereby effectively inhibiting or suppressing color mixing. For instance, as shown in FIG. 4, the green light emitting region overlaps with the blue light emitting region due to misalignment in manufacturing processes. Meanwhile, the blue light emitting region is up and the green light emitting region is down. Parts of them overlaps with each other. More specifically, the blue light emitting region, the hole blocking region corresponding to the blue light emitting region, the green light emitting region, and the hole blocking region corresponding to the green light emitting region are arranged from bottom to top. The color mixing region R1 (indicated by a dash line shown in FIG. 4) in the blue light emitting region can emit blue light normally since holes are not blocked by the hole blocking region. As to the color mixing region R2 (indicated by a dash line shown in FIG. 4) in the light emitting region, holes are blocked by the hole blocking region corresponding to the green blue light emitting region when the holes are transmitted from the blue light emitting region to the green light emitting region. Accordingly, the holes cannot get into the color mixing region R2 in the green light emitting region. Light rays with mixing colors will not be generated by the blue light emitting region and the green light emitting region, thereby effectively inhibiting or suppressing the color mixing.

Other details about the method for manufacturing the organic electroluminescence display device of the present application can be referred to description of the organic electroluminescence display device in above context, which is not detailed herein.

In the method for manufacturing the organic electroluminescence display device of the present application, the hole blocking layer 23 includes the first hole blocking region 231, the second hole blocking region 232, and the third hole blocking region 233 that are disposed at different positions. The first hole blocking region 231 is disposed at a position corresponding to the first light emitting region 221 of the light emitting layer 22, the second hole blocking region 232 is disposed at a position corresponding to the second light emitting region 222 of the light emitting layer 22, and the third hole blocking region 233 is disposed at a position corresponding to the third light emitting region 223 of the light emitting layer 22. When the light emitting regions of the light emitting layer 22 overlaps to each other due to misalignment, the overlapped light emitting regions have the hole blocking region located therebetween. Accordingly, this can effectively prevent the holes from passing through and prevent an upper light emitting region of the overlapped regions from emitting light, and avoid color mixed illumination caused by color mixing of the upper light emitting region and a lower light emitting region of the overlapped regions. Serious color mixing for the organic electroluminescence display device in existing arts is effectively solved and product yield is improved.

The present application also provides a display apparatus. The display apparatus includes a plurality of organic electroluminescence display devices, the structure of and the method for manufacturing each of the organic electroluminescence display devices can be referred to above context, which is not detailed herein.

Above all, while the preferred embodiments of the present application have been illustrated and described in detail, it is intended that the present application should not be limited to the preferred embodiment. Various modifications and alterations which maintain the realm of the present application can be made by persons skilled in this art. The protective scope of the present application is subject to the scope as defined in the claims.

The invention claimed is:

1. A method for manufacturing an organic electroluminescence display device, comprising:
   disposing a hole transport functional layer;
   disposing a light emitting layer on the hole transport functional layer, the light emitting layer comprising a first light emitting region, a second light emitting region, and a third light emitting region that emit light rays of different colors;
   disposing a hole blocking layer on the light emitting layer, the hole blocking layer comprising a first hole blocking region, a second hole blocking layer, and a third hole blocking layer that are disposed at different positions, the first hole blocking layer disposed at a position corresponding to the first light emitting region, the second hole blocking layer disposed at a position corresponding to the second light emitting region, the third hole blocking layer disposed at a position corresponding to the third light emitting region; and
   disposing an electron transport functional layer on the hole blocking layer,
   wherein the step of disposing the light emitting layer and the step of disposing the hole blocking layer comprises:
   adopting a same mask to manufacture the first light emitting region and the first hole blocking region under a same vacuum evaporation process;
   adopting a same mask to manufacture the second light emitting region and the second hole blocking region under a same vacuum evaporation process; and
   adopting a same mask to manufacture the third light emitting region and the third hole blocking region under a same vacuum evaporation process.

2. The method according to claim 1, wherein in the step of disposing the light emitting layer and the step of disposing the hole blocking layer, the first light emitting region, the first hole blocking region, the second light emitting region, the second hole blocking region, the third light emitting region, and the third hole blocking region are sequentially disposed.

3. The method according to claim 1, wherein the first light emitting region, the second light emitting region, the third light emitting region, the first hole blocking region, the second hole blocking region, and the third hole blocking region are manufactured using film metal masks.

4. The method according to claim 1, further comprising:
   disposing a fluorescent material layer between the hole transport functional layer and the light emitting layer, the fluorescent material layer comprising a first fluorescent material region, a second fluorescent material region, and a third fluorescent material region that correspond to different colors, the first fluorescent material region disposed at a position corresponding to the first light emitting region, the second fluorescent material region disposed at a position corresponding to the second light emitting region, the third fluorescent material region disposed at a position corresponding to the third light emitting region.

5. The method according to claim 4, wherein the first light emitting region, the second light emitting region, and the third light emitting region are of a blue region, a green region, and a red region, respectively, and the first fluorescent material region, the second fluorescent material region, and the third fluorescent material region are of a blue fluorescent material region, a green fluorescent material region, and a red fluorescent material region, respectively.

6. The method according to claim 1, wherein the hole transport functional layer comprises at least one of a hole transport layer and a hole injection layer.

7. The method according to claim 1, wherein the electron transport functional layer comprises at least one of an electron transport layer and an electron injection layer.

* * * * *